United States Patent
Watanabe

(10) Patent No.: US 7,625,798 B2
(45) Date of Patent: Dec. 1, 2009

(54) METHOD OF PRODUCING SEMICONDUCTOR MEMORY

(75) Inventor: Shuichi Watanabe, Miyagi (JP)

(73) Assignee: Oki Semiconductor Co., Ltd., Tokyo (JP)

( * ) Notice: Subject to any disclaimer, the term of this patent is extended or adjusted under 35 U.S.C. 154(b) by 0 days.

(21) Appl. No.: 12/314,107

(22) Filed: Dec. 4, 2008

(65) Prior Publication Data

US 2009/0155972 A1  Jun. 18, 2009

(30) Foreign Application Priority Data

Dec. 14, 2007  (JP)  ............... 2007-323223

(51) Int. Cl.
*H01L 21/336* (2006.01)
(52) U.S. Cl. .............. 438/257; 438/151; 438/279; 438/412; 438/479
(58) Field of Classification Search ............... None
See application file for complete search history.

(56) References Cited

U.S. PATENT DOCUMENTS 5,559,048 A * 9/1996 Inoue ............... 438/257
6,500,710 B2 * 12/2002 Nakagawa ............... 438/257

FOREIGN PATENT DOCUMENTS

| JP | 03-052267 | 3/1991 |
|---|---|---|
| JP | 03-126266 | 5/1991 |
| JP | 2004-055657 | 2/2004 |

* cited by examiner

*Primary Examiner*—Zandra Smith
*Assistant Examiner*—Khanh B Duong
(74) *Attorney, Agent, or Firm*—Kubotera & Associates, LLC

(57) ABSTRACT

A semiconductor memory includes a plurality of memory cell transistors each having a laminated gate. A method of producing the semiconductor memory includes the steps of: forming a plurality of element separation regions for separating the memory cell transistors; forming a first conductive layer through a gate oxide film; etching the first conductive layer to form a plurality of slits; forming spacers on sidewall portions of each of the slits; forming a second conductive layer through an insulating film; etching the first conductive layer, the second conductive layer, and the insulating film using one single mask to form the laminated gate; implanting a conductive impurity into the semiconductor substrate exposed on both sides of the laminated gate to form a drain/source region; forming an interlayer insulating film; forming a contact hole penetrating the interlayer insulating film to reach the semiconductor substrate.

3 Claims, 9 Drawing Sheets

METHOD OF PRODUCING SEMICONDUCTOR MEMORY

BACKGROUND OF THE INVENTION AND RELATED ART STATEMENT

The present invention relates to a method of producing a semiconductor memory. More specifically, the present invention relates to a method of producing a semiconductor memory, in which each of a plurality of memory cell transistors formed on a semiconductor substrate includes a laminated gate formed of a floating gate and a control gate.

A non-volatile semiconductor memory has a property of holding data stored therein even after power is turned off, and has been used for storing firmware or supplying application though a cartridge.

An EPROM (Erasable Programmable Read-Only Memory) is one type of the non-volatile semiconductor memory. A plurality of memory cell transistors constitutes the EPROM, and each of the memory cell transistors includes a laminated gate (a double gate) formed of a floating gate and a control gate.

When data are written into the EPROM, a source and a substrate are grounded, and a high voltage is applied to a drain and the control gate. As a result, electrons moving in a channel from the source to the drain capture high kinetic energy and become hot electrons. Some of the hot electrons jump over a gate oxide film and pour into the floating gate. Accordingly, data of one bit are written in the memory cell transistor.

In this case, the floating gate has a negative potential due to negative electrons pouring into the floating gate. As a result, a threshold voltage Vth1 of the memory cell transistor relative to the control gate becomes greater than an initial value Vth0. Accordingly, when data are read out, a voltage between the threshold voltage Vth1 and the initial value Vth0 is applied to the control gate, and it is determined that a value of the memory cell transistor is "0" or "1" depending on whether the memory cell transistor is turned on or not. In the EPROM, a large number of the memory cell transistors described above are arranged on a semiconductor substrate, thereby constituting a large capacity memory device.

FIGS. 1(a) to 1(e) are views showing a method of producing a conventional non-volatile semiconductor memory having a laminated gate structure. More specifically, FIGS. 1(d) and 1(e) are plan views of the conventional non-volatile semiconductor memory; FIG. 1(a) is a sectional view taken along a line 1a-1a in FIG. 1(d); FIG. 1(b) is a sectional view taken along a line 1b-1b in FIG. 1(e); and FIG. 1(c) is a sectional view of the conventional non-volatile semiconductor memory.

FIGS. 2(a) to 2(e) are views showing the method of producing the conventional non-volatile semiconductor memory having a laminated gate structure. More specifically, FIGS. 2(d) and 2(e) are plan views of the conventional non-volatile semiconductor memory; FIG. 2(a) is a sectional view taken along a line 2a-2a in FIG. 2(d); FIG. 2(b) is a sectional view of the conventional non-volatile semiconductor memory; and FIG. 2(c) is a sectional view taken along a line 2c-2c in FIG. 2(e).

As shown in FIGS. 1(a) and 1(d), first, a silicon (Si) single crystal substrate 1 (a substrate 1) is prepared. Then, element separation regions 20 are formed in the substrate 1 for separating an active region through a well-known element separation technology. Then, an impurity is implanted into the active region of the substrate 1 through a well-known ion implantation technology, thereby controlling a threshold voltage of a memory cell transistor. Then, a gate oxide film 2 is formed on a surface of the substrate 1 with a thermal oxidation method.

As shown in FIGS. 1(b) and 1(e), in the next step, a poly-silicon film 3 as a first layer constituting a floating gate is formed on an entire surface of the structure with a well-known CVD (Chemical Vapor Deposition) method. The, an impurity such as phosphorous is implanted into the poly-silicon film 3 for reducing an electrical resistivity of the floating gate.

In the next step, a resist pattern is formed on the poly-silicon film 3 through a well-known photolithography technology. The resist pattern has opening portions extending along centerlines of the element separation regions 20 and having a width slightly larger than a channel width of the memory cell transistor. Then, the poly-silicon film 3 is etched through a well-known dry etching technology with the resist as a mask, thereby forming slit portions 3a along the centerlines of the element separation regions 20.

As shown in FIG. 1(c), in the next step, an interlayer insulation film 4 is formed on the entire surface of the structure with the well-known CVD method. Then, a poly-silicon film 5 as a second layer constituting a control gate is formed on the interlayer insulation film 4 with the well-known CVD method. Then, a composite film 6 formed of materials such as tungsten (W) and silicon (Si) is formed on the poly-silicon film 5 for reducing a wiring resistivity of the control gate with the well-known CVD method.

As shown in FIGS. 2(a) and 2(d), in the next step, a resist pattern is formed on the structure through the well-known photolithography technology. The resist pattern has opening portions corresponding to a pattern of a laminated gate. Then, the composite film 6, the poly-silicon film 5, the interlayer insulation film 4, and the poly-silicon film 3 are sequentially etched in a depth direction through the well-known dry etching technology with the resist as a mask, thereby forming laminated gates 21.

Through the steps described above, when a plurality of the layers is concurrently etched using the single mask, the poly-silicon film 5 and the poly-silicon film 3 become the control gates 5 and the floating gates 3 in a self-compatible manner along a channel length direction.

In the step described above, a portion of the floating gate 3 corresponding to the slit portion 3a has a thickness smaller than that of other portion of the floating gate 3. Accordingly, in the process of the etching, a surface of the substrate 1 under the slit portions 3a is etched, thereby forming trenches 7 in the substrate 1 along the slit portions 3a.

As shown in FIG. 2(b), in the next step, a silicon oxide ($SiO_2$) film (not shown) is formed on the entire surface of the structure with the well-known CVD method as a protective layer during a process of ion implantation.

In the next step, an impurity of an n-type such as phosphorous is implanted with the laminated gates 21 thus patterned as a mask with the well-known ion implantation method. Accordingly, drain/source regions 8 containing a high concentration n-type impurity are formed in the surface of the substrate 1 exposed on both sides of the laminated gates 21 and bottom surfaces of the trenches 7.

As shown in FIGS. 2(f) and 2(e), in the next step, an interlayer insulation film 9 is formed on the entire surface of the structure with the well-known CVD method. Then, contact holes 10 are formed in the interlayer insulation film 9 up to the surface of the substrate 1 through the well-known photolithography technology and the well-known dry etching technology.

As shown in FIG. 2(e), the contact hole 10 is formed between the element separation regions 20 over the trench 7, and extends to the drain/source regions 8 facing with each other with the trench 7 in between. Then, a conductive material is filled in the contact holes 10 to form a wiring portion (not shown), thereby completing the conventional non-volatile semiconductor memory. (Refer to Patent Reference 1, Patent Reference 2, and Patent Reference 3)

Patent Reference 1: Japanese Patent Publication No. 03-126266

Patent Reference 2: Japanese Patent Publication No. 03-52267

Patent Reference 3: Japanese Patent Publication No. 2004-55657

In the conventional non-volatile semiconductor memory described above, the trenches 7 have a relatively large width. When the contact holes 10 formed in the interlayer insulation film 9 have a small diameter, or the contact holes 10 are formed at positions shifted relative to the trenches 7 due to a shift in alignment of the mask, it is difficult to sufficiently expose an upper surface of the drain/source region 8 in the contact hole 10. Accordingly, the wiring portion filled in the contact hole 10 may not sufficiently contact with the source/drain region 8, thereby increasing a contact resistivity and deteriorating performance of the conventional non-volatile semiconductor memory.

To this end, it has been tried to reduce a width of the trenches 7 through improving a mask or optimizing a condition of the photolithography. However, it is difficult to reduce a width of the trenches 7 only through optimizing a condition of the photolithography, and to completely solve the problems of the conventional non-volatile semiconductor memory.

In view of the problems described above, an object of the present invention is to provide a method of producing a non-volatile semiconductor memory capable of solving the problems of the conventional semiconductor memory. In the method of the present invention, it is possible to stably produce the non-volatile semiconductor memory having a laminated gate structure at a high yield.

Further objects and advantages of the invention will be apparent from the following description of the invention.

SUMMARY OF THE INVENTION

In order to attain the objects described above, according to the present invention, a semiconductor memory includes a plurality of memory cell transistors formed on a semiconductor substrate, and each of the memory cell transistors includes a laminated gate formed of a floating gate and a control gate.

According to the present invention, a method of producing the semiconductor memory includes the steps of: forming a plurality of element separation regions in the semiconductor substrate in a row direction and a column direction for separating the memory cell transistors; forming a first conductive layer on an entire surface of the semiconductor substrate through a gate oxide film; etching the first conductive layer to form a plurality of slits; forming spacers on sidewall portions of each of the slits; forming a second conductive layer on the entire surface of the semiconductor substrate through an insulating film; etching the first conductive layer, the second conductive layer, and the insulating film using one single mask to form the laminated gate; implanting a conductive impurity into the entire surface of the semiconductor substrate exposed on both sides of the laminated gate to form a drain/source region; forming an interlayer insulating film on the entire surface of the semiconductor substrate; and forming a contact hole penetrating the interlayer insulating film to reach the semiconductor substrate.

In the present invention, even when the contact hole has an insufficient opening portion, or the contact hole is formed at a shifted position, it is possible to sufficiently contact a wiring portion with the source/drain region. As a result, it is possible to enlarge a margin relative to a manufacturing variance, thereby stabilizing quality and increasing yield.

BRIEF DESCRIPTION OF THE DRAWINGS

FIGS. 1(a) to 1(e) are views showing a method of producing a conventional non-volatile semiconductor memory having a laminated gate structure, wherein FIGS. 1(d) and 1(e) are plan views of the conventional non-volatile semiconductor memory, FIG. 1(a) is a sectional view taken along a line 1a-1a in FIG. 1(d), FIG. 1(b) is a sectional view taken along a line 1b-1b in FIG. 1(e), and FIG. 1(c) is a sectional view of the conventional non-volatile semiconductor memory;

FIGS. 2(a) to 2(e) are views showing the method of producing the conventional non-volatile semiconductor memory having the laminated gate structure, wherein FIGS. 2(d) and 2(e) are plan views of the conventional non-volatile semiconductor memory, FIG. 2(a) is a sectional view taken along a line 2a-2a in FIG. 2(d), FIG. 2(b) is a sectional view of the conventional non-volatile semiconductor memory, and FIG. 2(c) is a sectional view taken along a line 2c-2c in FIG. 2(e);

FIGS. 3(a) and 3(b) are views No. 1 showing a method of producing a non-volatile semiconductor memory according to an embodiment of the present invention, wherein FIG. 3(a) is a plan view of the non-volatile semiconductor memory, and FIG. 3(b) is a sectional view thereof taken along a line 3a-3a in FIG. 3(a);

FIGS. 4(a) and 4(b) are views No. 2 showing the method of producing the non-volatile semiconductor memory according to the embodiment of the present invention, wherein FIG. 4(a) is a plan view of the non-volatile semiconductor memory, and FIG. 4(b) is a sectional view thereof taken along a line 4a-4a in FIG. 4(a);

FIGS. 5(a) and 5(b) are views No. 3 showing the method of producing the non-volatile semiconductor memory according to the embodiment of the present invention, wherein FIG. 5(a) is a plan view of the non-volatile semiconductor memory, and FIG. 5(b) is a sectional view thereof taken along a line 5a-5a in FIG. 5(a);

FIGS. 7(a) and 7(b) are views No. 5 showing the method of producing the non-volatile semiconductor memory according to the embodiment of the present invention, wherein FIG. 7(a) is a plan view of the non-volatile semiconductor memory, and FIG. 7(b) is a sectional view thereof taken along a line 7a-7a in FIG. 7(a);

9(a) is a plan view of the non-volatile semiconductor memory, and FIG. 9(b) is a sectional view thereof taken along a line 9a-9a in FIG. 9(a).

DETAILED DESCRIPTION OF PREFERRED EMBODIMENTS

Figure 1A:
Figure 1B:
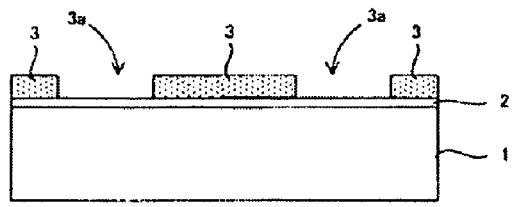
Figure 1C:
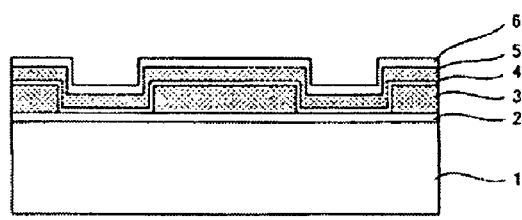
Figure 1D:
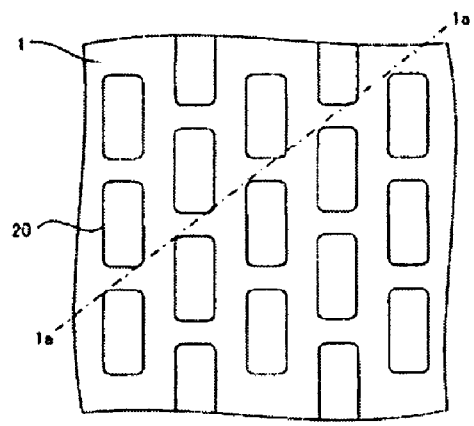
Figure 1E:
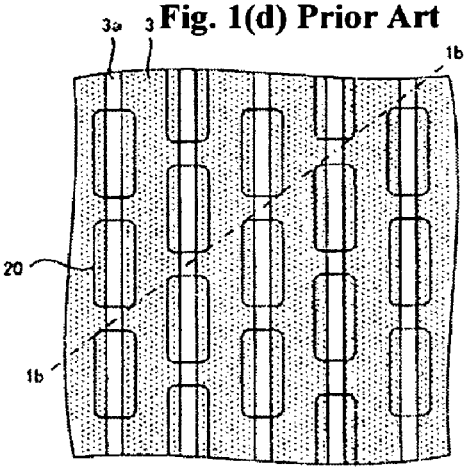
Figure 2A:
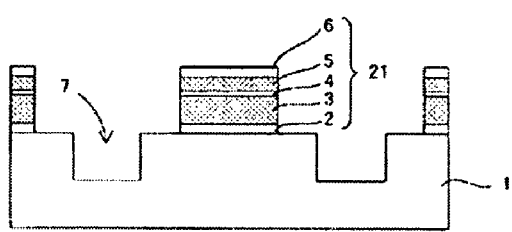
Figure 2B:
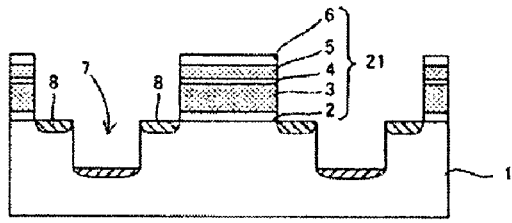
Figure 2C:
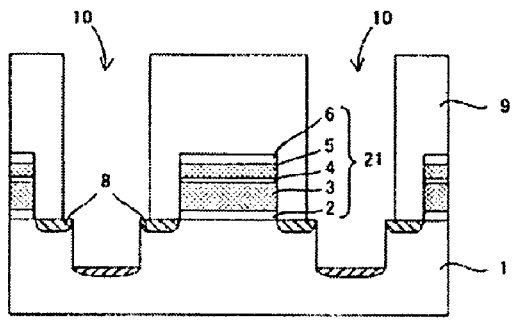
Figure 2D:
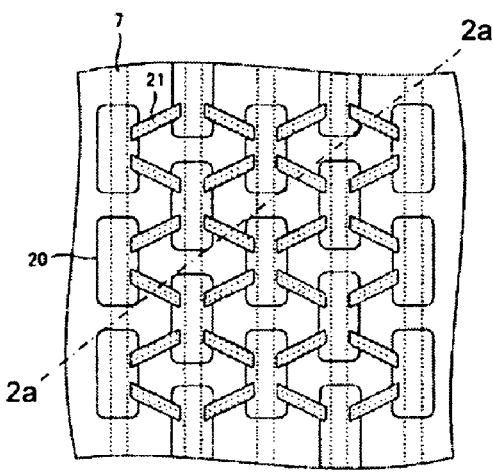
Figure 2E:
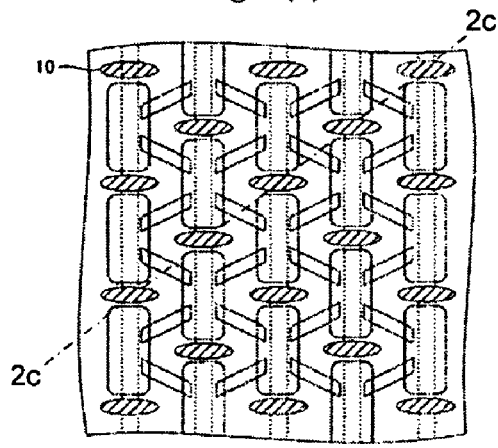

Hereunder, preferred embodiments of the present invention will be explained with reference to the accompanying drawings. In the accompanying drawings, substantially similar components or equivalent components are designated with the same reference numerals.

Figure 9A:
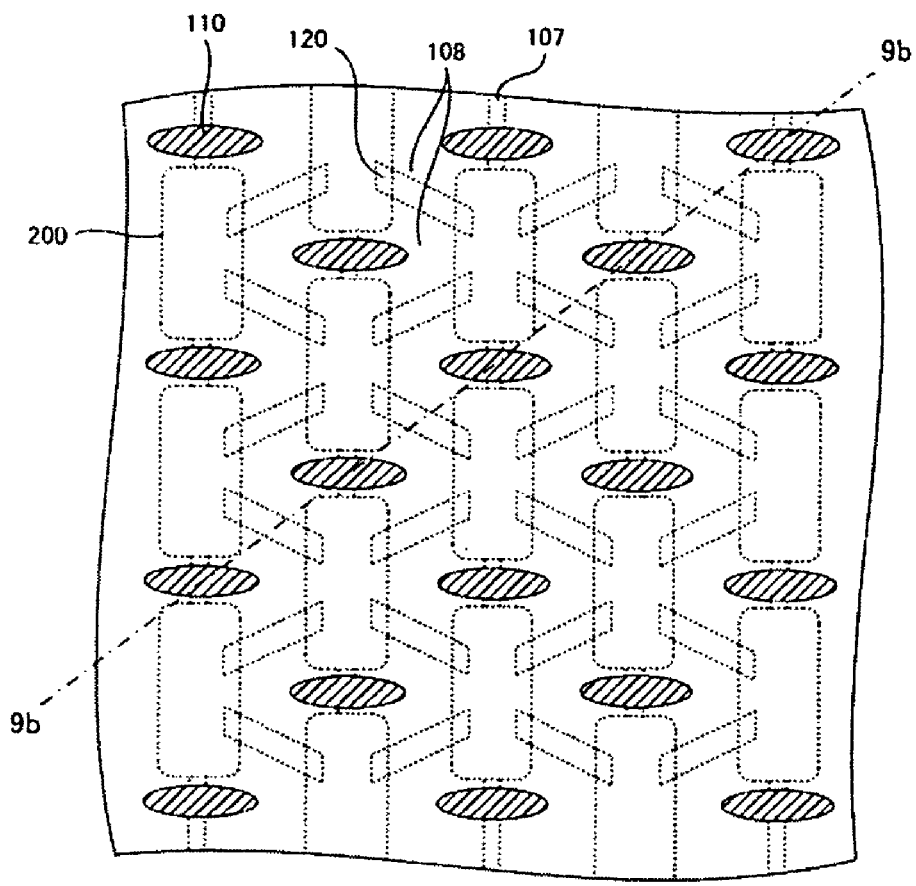
FIGS. 9(a) and 9(b) are views No. 7 showing the method of producing the non-volatile semiconductor memory according to the embodiment of the present invention, wherein FIG.
Figure 9B:
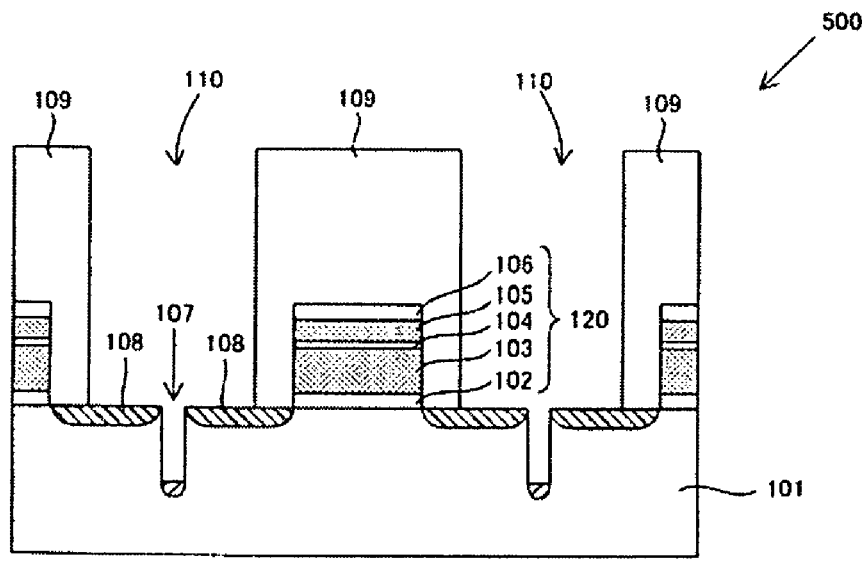

FIGS. 9(a) and 9(b) are views No. 7 showing a method of producing a non-volatile semiconductor memory 500 according to an embodiment of the present invention. More specifically, FIG. 9(a) is a plan view of the non-volatile semiconductor memory 500, and FIG. 9(b) is a sectional view thereof taken along a line 9a-9a in FIG. 9(a).

As shown in FIG. 9(b), an interlayer insulating film 109 covers a surface of the non-volatile semiconductor memory 500, and contact holes 110 penetrate the interlayer insulating film 109. A wiring portion (not shown) is filled in each of the contact holes 110 to contact to a drain/source region of a memory cell transistor in a lower layer, thereby making it possible to write and read data relative to the memory cell transistor from outside. In FIG. 9(a), the memory cell transistor disposed below the interlayer insulating film 109 is represented with a hidden line.

In the embodiment, the non-volatile semiconductor memory 500 includes a plurality of the memory cell transistors. A plurality of element separation regions 200 formed of silicon oxide ($SiO_2$) is formed on a silicon single crystal substrate 101 having, for example, a p-type conductive type for separating the memory cell transistors with each other.

As shown in FIG. 9(a), each of the element separation regions 200 has a substantially rectangular shape, and is positioned away from other ones by a specific distance in an up-down direction (a column direction) and a left-right direction (a row direction). Further, the element separation regions 200 are arranged alternately in the left-right direction (the row direction).

In the embodiment, a laminated gate 120 includes a floating gate 103 and a control gate 105, and extends obliquely over the element separation regions 200 arranged next to each other in the left-right direction (the row direction). More specifically, four of the laminated gates 120 extend from one of the element separation regions 200 toward four of the element separation regions 200 arranged adjacent to the one of the element separation regions 200 in an upper right direction, a lower right direction, an upper left direction, and a lower left direction.

In the embodiment, drain/source regions 108 are formed on both sides of each of the laminated gates 120, thereby constituting a unit memory cell. Further, trenches 107 are formed along centerlines of the element separation regions 200 arranged in the up-down direction (the column direction). The trenches 107 have a width smaller than that of a conventional semiconductor memory. The contact holes 110 are disposed between the element separation regions 200 arranged in the up-down direction (the column direction). As described above, the contact holes 110 penetrate the interlayer insulating film 109 and reach the drain/source regions 108 of the memory cell transistors disposed in a lower layer.

As shown in FIG. 9(b), each of the memory cell transistors includes the gate laminated gate 120 formed on the silicon single crystal substrate 101 (or the substrate 101) with a gate oxide film 102 in between. Each of the memory cell transistors further includes the drain/source regions 108 containing an n-type conductive impurity at a high concentration and arranged on the both sides of the laminated gate 120.

In the embodiment, each of the element separation regions 200 includes the floating gate 103 formed of poly-crystal silicon with an impurity such as phosphorous doped therein and formed on the gate oxide film 102; an interlayer insulating film 104 formed of $SiO_2$; the control gate 105 formed of poly-crystal silicon with an impurity such as phosphorous (P) doped therein; and a composite film 106 formed of tungsten (W) and silicon (Si), each sequentially laminated in this order.

In the embodiment, the interlayer insulating film 109 formed of, for example, BPSG (Borophosphosilicate Glass) is formed on the surface of the substrate 101 with the memory cell transistors formed thereon. As described above, the trenches 7 formed along the centerlines of the element separation regions 200 arranged in the up-down direction (the column direction) have a small width. Accordingly, it is possible to obtain a sufficient area of an upper surface of the drain/source region 108 exposed in the contact hole 110. As a result, it is possible to increase an electrical contact area between the wiring portion (not shown) filled in the contact hole 110 and the drain/source region 108, thereby securing a margin relative to a mask shift or an insufficient opening of the contact hole 110.

A method of producing the non-volatile semiconductor memory 500 having the configuration described above will be explained next with reference to FIGS. 3(a)-3(b) to FIGS. 9(a)-9(b).

Figure 3A:
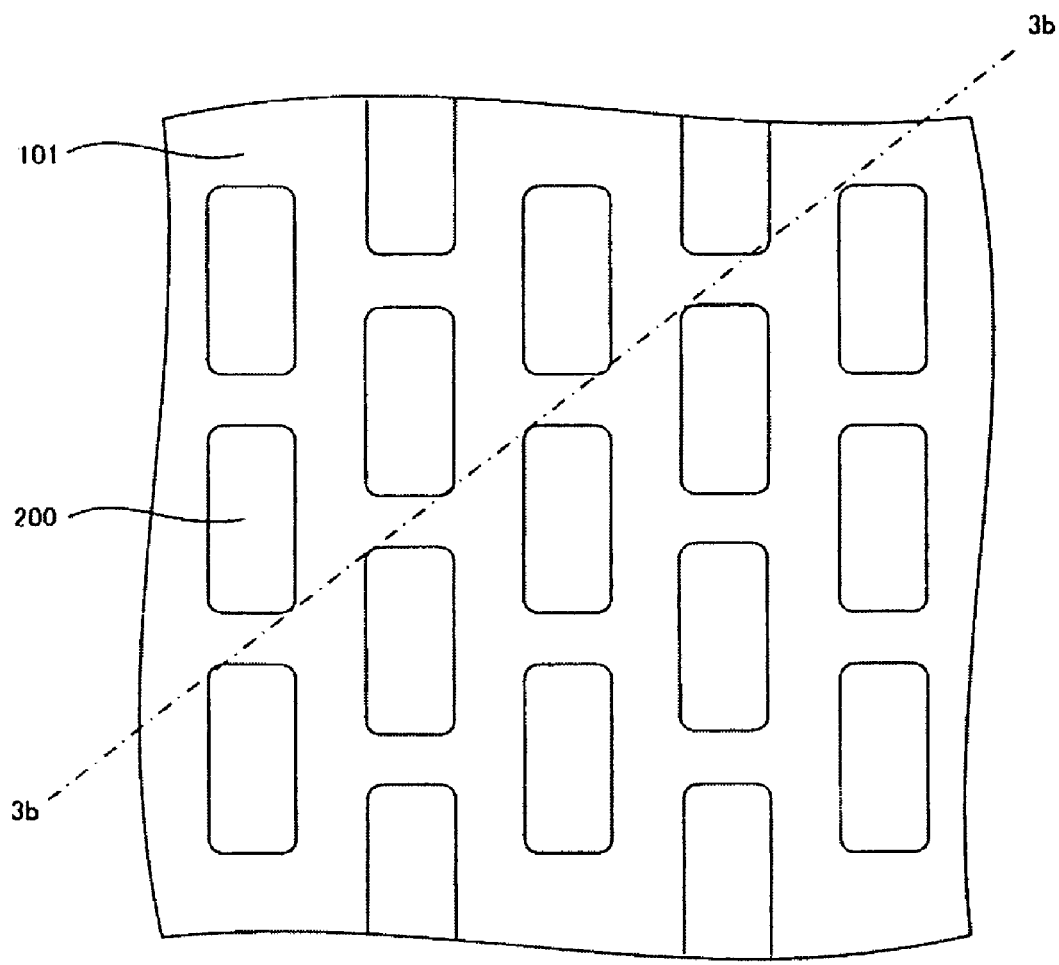
Figure 3B:
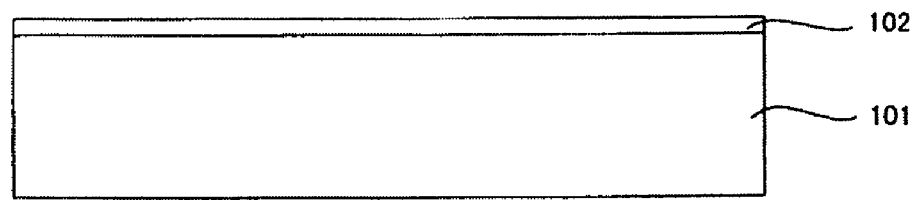

FIGS. 3(a) and 3(b) are views No. 1 showing a method of producing the non-volatile semiconductor memory 500 according to the embodiment of the present invention. More specifically, FIG. 3(a) is a plan view of the non-volatile semiconductor memory 500, and FIG. 3(b) is a sectional view thereof taken along a line 3a-3a in FIG. 3(a).

Figure 4A:
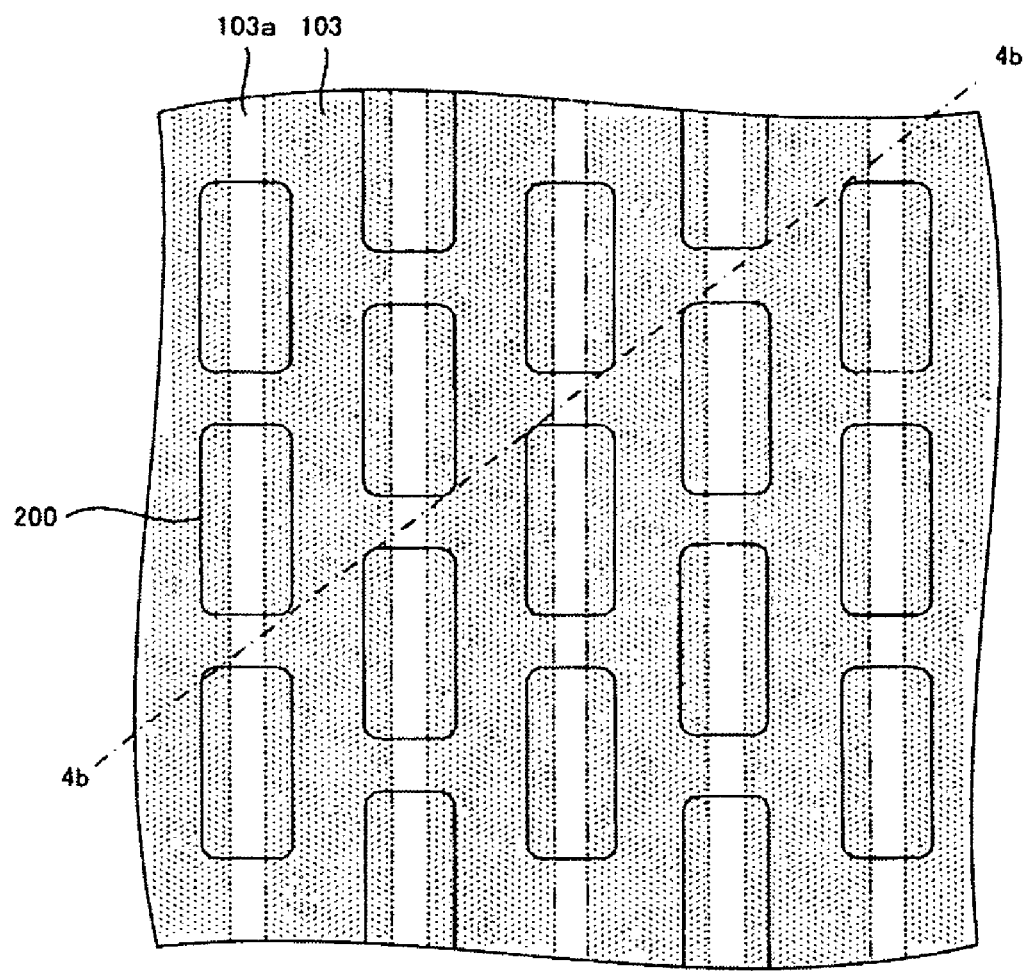
Figure 4B:
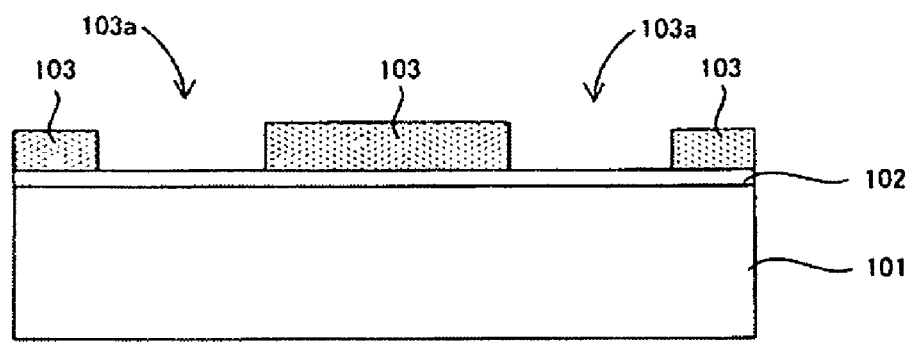

FIGS. 4(a) and 4(b) are views No. 2 showing the method of producing the non-volatile semiconductor memory 500 according to the embodiment of the present invention. More specifically, FIG. 4(a) is a plan view of the non-volatile semiconductor memory 500, and FIG. 4(b) is a sectional view thereof taken along a line 4a-4a in FIG. 4(a).

Figure 5A:
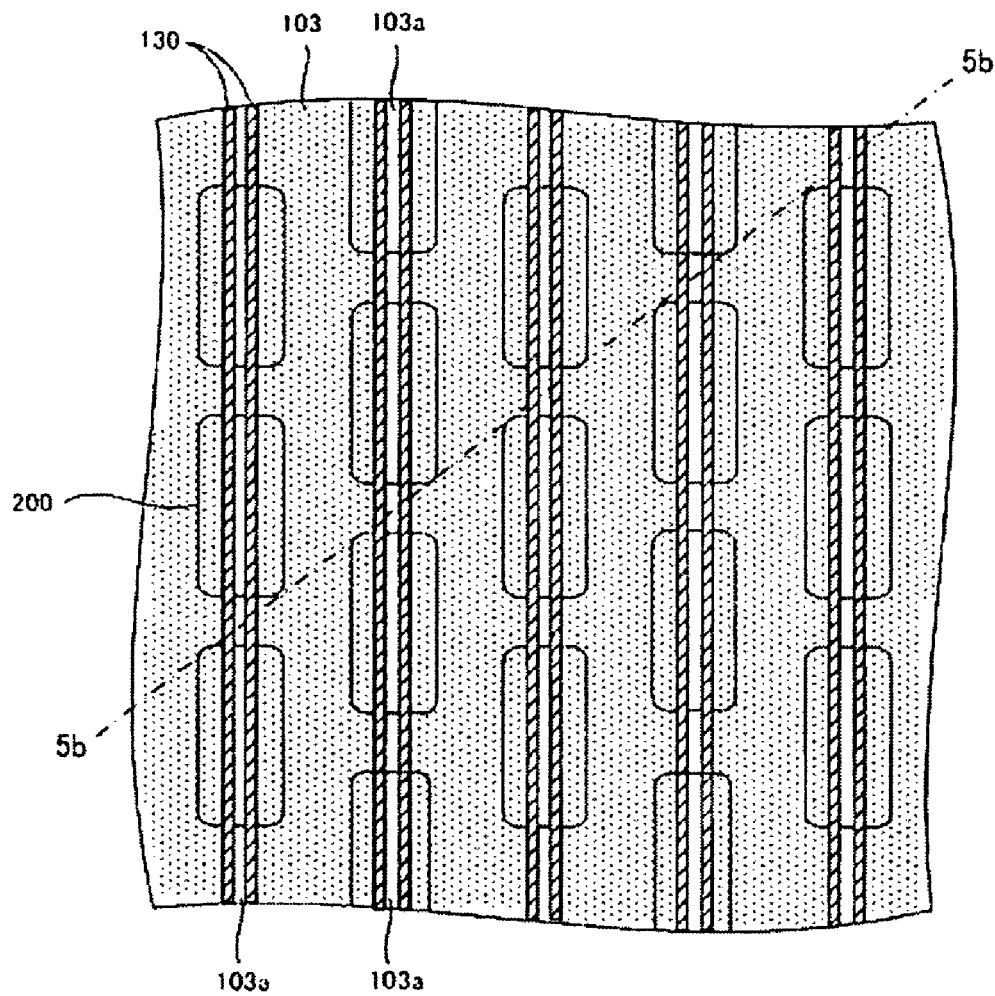
Figure 5B:
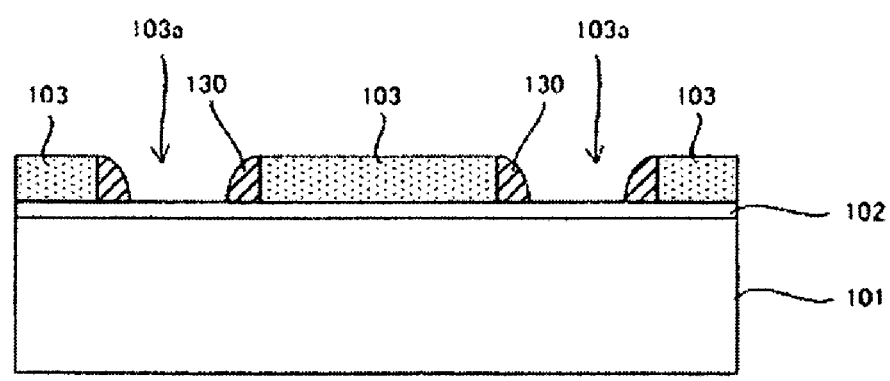

FIGS. 5(a) and 5(b) are views No. 3 showing the method of producing the non-volatile semiconductor memory 500 according to the embodiment of the present invention. More specifically, FIG. 5(a) is a plan view of the non-volatile semiconductor memory 500, and FIG. 5(b) is a sectional view thereof taken along a line 5a-5a in FIG. 5(a).

Figure 6A:
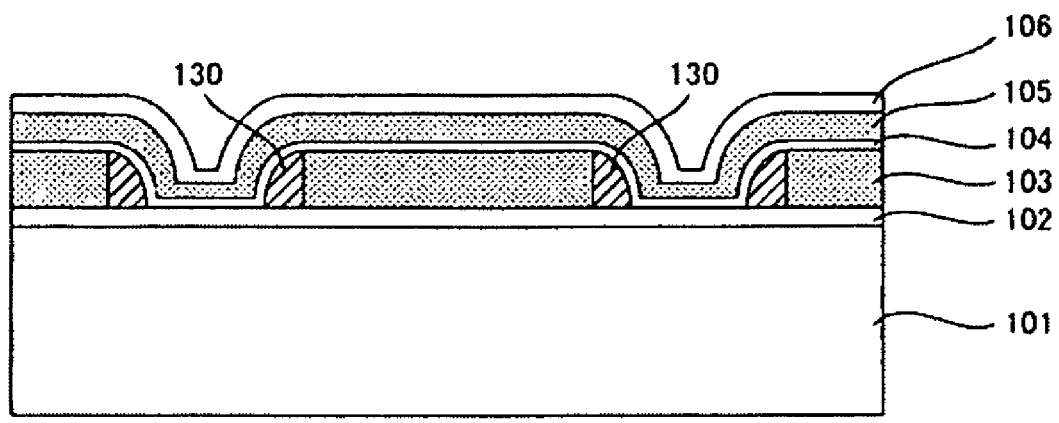
FIGS. 6(A) and 6(B) are sectional views No. 4 showing the method of producing the non-volatile semiconductor memory according to the embodiment of the present invention.
Figure 6B:
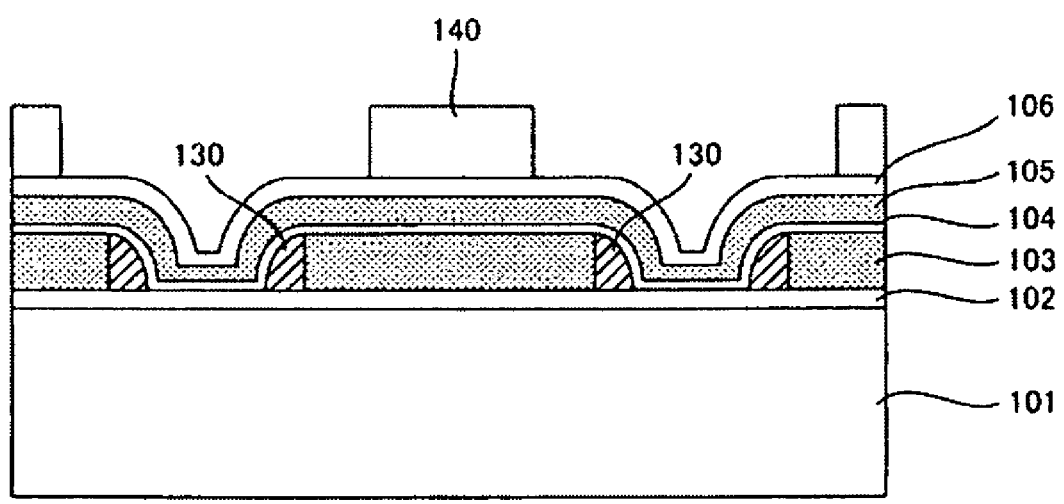

FIGS. 6(A) and 6(B) are sectional views No. 4 showing the method of producing the non-volatile semiconductor memory 500 according to the embodiment of the present invention.

Figure 7A:
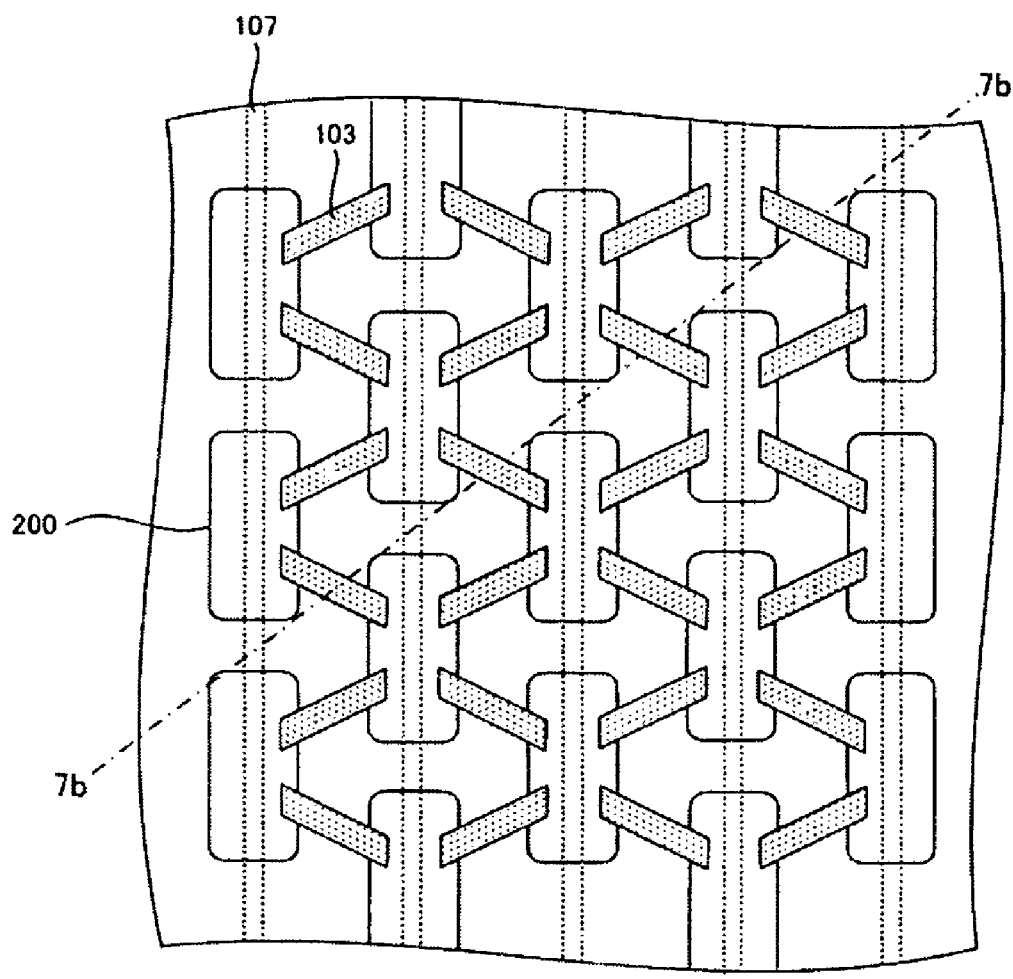
Figure 7B:
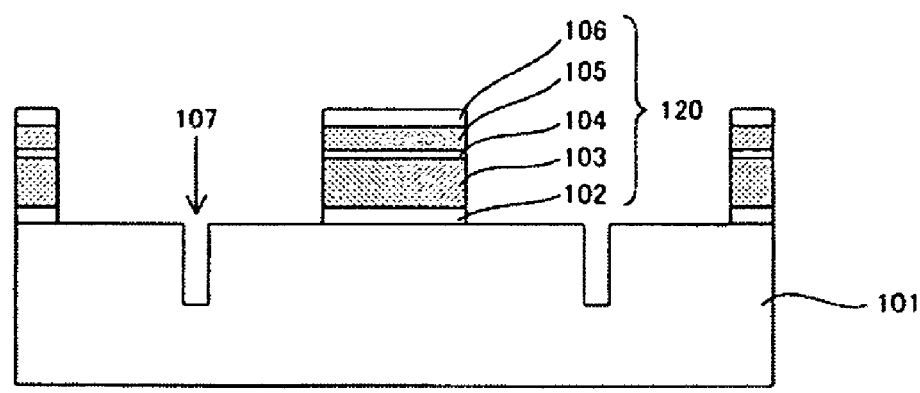

FIGS. 7(a) and 7(b) are views No. 5 showing the method of producing the non-volatile semiconductor memory 500 according to the embodiment of the present invention. More specifically, FIG. 7(a) is a plan view of the non-volatile semiconductor memory 500, and FIG. 7(b) is a sectional view thereof taken along a line 7a-7a in FIG. 7(a).

Figure 8:
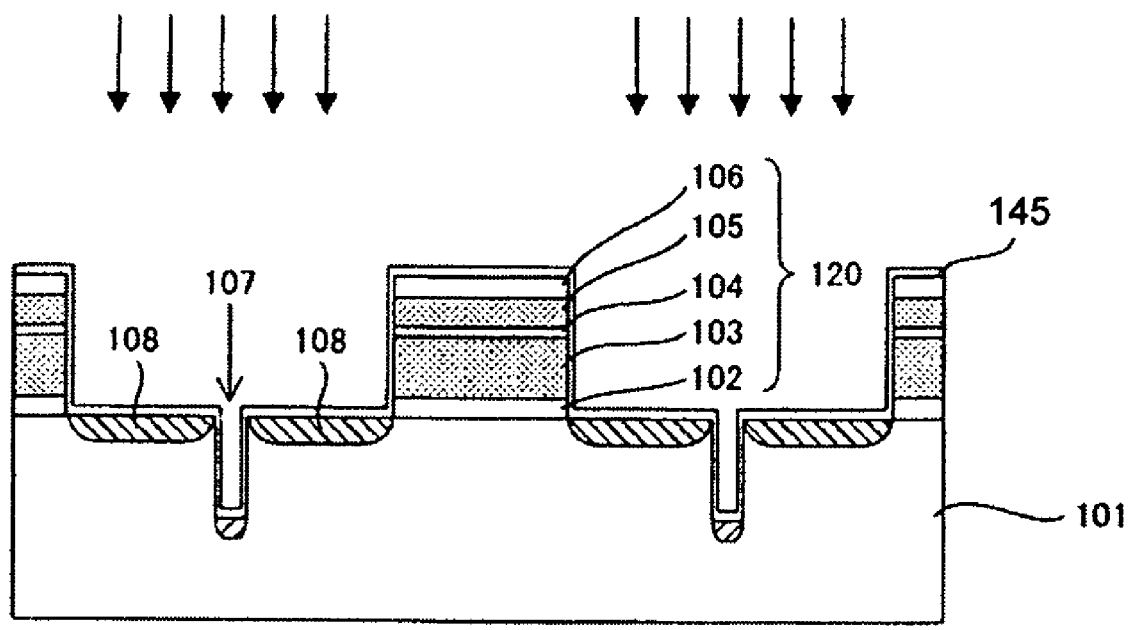
FIG. 8 is a sectional view No. 6 showing the method of producing the non-volatile semiconductor memory according to the embodiment of the present invention.

FIG. 8 is a sectional view No. 6 showing the method of producing the non-volatile semiconductor memory 500 according to the embodiment of the present invention.

As shown in FIGS. 3(a) and 3(b), first, a pad $SiO_2$ film (not shown) is grown on the substrate 101 formed of the p-type silicon single crystal with a thermal oxidation method. Then, a silicon nitride ($SiN_4$) film (not shown) is deposited on the pad $SiO_2$ film with a well-known CVD (Chemical Vapor Deposition) method using silane ($SiH_4$) and ammonium ($NH_4$) as reaction gasses.

In the next step, the pad SiO$_2$ film, the silicon nitride (SiN$_4$) film, and the substrate 101 are etched to form a silicon trench. Then, an SiO$_2$ film is formed in the silicon trench with the thermal oxidation method, and a CVD film formed of SiO$_2$ is formed in the silicon trench with the well-known CVD method, thereby forming the element separation regions 200.

In the next step, the silicon nitride film remaining on the surface of the substrate 101 is removed with hot phosphorous acid, and the pad SiO$_2$ film is removed with fluoric acid. Then, a p-type conductive impurity such as boron (B) is implanted into an active region surface with a well-known ion implantation method, thereby controlling a threshold voltage of the memory cell transistors. Then, the gate oxide film 102 is formed on the surface of the substrate 101 with the thermal oxidation method.

As shown in FIGS. 4(a) and 4(b), in the next step, a poly-crystal silicon film 103 constituting the floating gates as a first layer is deposited on the gate oxide film 102 with the well-known CVD method using silane (SiH$_4$) as a reaction gas. Then, an impurity such as phosphorous (P) is diffused to reduce an electrical resistivity of the poly-crystal silicon film 103.

In the next step, a resist is formed on the poly-crystal silicon film 103 through a well-known photolithography technology. The resist has opening portions extending along the centerlines of the element separation regions 200 arranged in the column direction and having a width slightly larger than a channel width of the memory cell transistors. Then, the poly-crystal silicon film 103 is etched through dry etching with the resist as a mask, thereby forming slit portions 103a in the poly-crystal silicon film 103 extending along the centerlines of the element separation regions 200. As a result, the poly-crystal silicon film 103 is divided in the column direction with the slit portions 103a.

As shown in FIGS. 5(a) and 5(b), in the next step, an SiO$_2$ film constituting a spacer is deposited on an entire surface of a structure with the well-known CVD method using silane (SiH$_4$) and oxygen (O$_2$) as reaction gasses. In this step, the SiO$_2$ film is formed to fill the slit portions 103a. Then, the SiO$_2$ film is etched through anisotropy etching using reactive ions, so that the SiO$_2$ film is left only on sidewall portions of the slit portions 103a (that is, sidewall portions of the poly-crystal silicon film 103 thus divided), thereby forming spacers 130 on the sidewall portions of the slit portions 103a.

In the embodiment, through forming the spacers 130 on the sidewall portions of the slit portions 103a, it is possible to substantially reduce a width of the slit portions 103a. The spacers 130 are formed on both of the sidewall portions of the slit portions 103a, and may be formed on one of the sidewall portions of the slit portions 103a.

As shown in FIGS. 6(a) and 6(b), in the next step, the interlayer insulating film 104 formed of an SiO$_2$ film is formed on the entire surface of the structure with the well-known CVD method using silane (SiH$_4$) and oxygen (O$_2$) as reaction gasses. Then, a poly-crystal silicon film 105 constituting the control gates as a second layer is deposited on the entire surface of the structure with the well-known CVD method using silane (SiH$_4$) as a reaction gas. Then, an impurity such as phosphorous (P) is diffused in the poly-crystal silicon film 105 to reduce an electrical resistivity thereof.

In the next step, the composite film 106 formed of tungsten (W) and silicon (Si) is deposited on the entire surface of the structure with the well-known CVD method using tungsten hexafluoride (WF$_6$) silane (SiH$_4$) as reaction gasses, thereby reducing a wiring resistivity of the control gates. The layers described above are sequentially formed on the poly-crystal silicon film 103, thereby forming the laminated gates 120.

Then, a photo resist 140 corresponding to a laminated gate pattern is formed on the structure.

As shown in FIGS. 7(a) and 7(b), in the next step, the composite film 106, the poly-crystal silicon film 105, the interlayer insulating film 104, and the poly-crystal silicon film 103 are sequentially etched in a depth direction through opening portions of the photoresist 140, thereby patterning the laminated gates 120. When a plurality of the layers is concurrently etched using one single mask as described above, the control gates 105 and the floating gates 103 are formed in a self-compatible manner in a channel length direction.

In the etching process described above, the substrate 101 at portions of the laminated gates 120 having a small thickness is etched to form the trenches 107. At this time, with the spacers 130 formed on the both sidewall portions of the gate oxide film 102, the portions of the substrate 101 thus etched has a small width, thereby reducing a width of the trenches 107.

As shown in FIG. 8, in the next step, an SiO$_2$ film 145 is formed on the entire surface of the structure with the well-known CVD method using silane (SiH$_4$) and oxygen (O$_2$) as reaction gasses. The SiO$_2$ film 145 functions as a protective film upon implanting ions to form the drain/source regions 108.

In the next step, an n-type impurity such as phosphorous (P) is implanted with the well-known ion implantation method with the laminated gates 120 as a mask, thereby forming the drain/source regions 108 containing the n-type impurity at a high concentration on the surfaces of the substrate 101 exposed at both sides of the gate oxide film 102 and bottom surfaces of the trenches 107. In this step, the drain/source regions 108 are formed in a self-compatible manner with respect to the laminated gates 120. Then, the SiO$_2$ film 145 is removed using fluoric acid.

As shown in FIGS. 9(a) and 9(b), in the next step, the interlayer insulating film 109 formed of BPSG is deposited on the entire surface of the structure with the well-known CVD method. Then, the contact holes 110 penetrating the interlayer insulating film 109 and reaching the substrate 101 are formed with the well-known photolithography technology and the well-known dry etching technology.

In the embodiment, the contact holes 110 are disposed between the element separation regions 200 arranged in the column direction over the trenches 107 formed along the centerlines of the element separation regions 200, and extend to the drain/source regions 108 facing with each other with the trenches 107 in between. Then, the wiring portion (not shown) is formed on the surface of the structure to fill the contact holes, thereby completing the non-volatile semiconductor memory 500.

As described above, in the embodiment, the spacers 130 are formed on the sidewall portions of the floating gates 103. Accordingly, it is possible to reduce the width of the slit portions 103a of the poly-crystal silicon film 103 extending along the centerlines of the element separation regions 200, thereby reducing the width of the trenches 107.

In the embodiment, it is possible to easily reduce the width of the trenches 107 formed in the substrate 101 upon etching the laminated gates 120, which is difficult only through optimizing a condition of the photolithography. Accordingly, it is possible to obtain a sufficient area of the upper surface of the drain/source regions 108 exposed in the contact hole 110, thereby increasing a margin relative to an alignment shift or an insufficient opening of the contact hole 110. As a result, it is possible to drastically reduce production defects due to improper contact, thereby increasing yield and stabilizing quality.

In a conventional method, an element separation region is continuously formed, so that a trench is not formed in an active region. Accordingly, it is necessary to change a layout of the active region. As a result, in order to maintain a circuit arrangement of a semiconductor memory, it is necessary to change a pattern of a wiring portion.

In the embodiment, it is possible to reduce the width of the trenches 107 simply through forming the spacers 130 on the sidewall portions of the floating gates 103. Accordingly, it is possible to maintain a layout of the active region, and is not necessary to change a pattern of the wiring portion, thereby making it easy to implement the method to an actual manufacturing line.

The disclosure of Japanese Patent Application No. 2007-323223, filed on Dec. 14, 2007, is incorporated in the application by reference.

While the invention has been explained with reference to the specific embodiments of the invention, the explanation is illustrative and the invention is limited only by the appended claims.

What is claimed is:

1. A method of producing a semiconductor memory including a plurality of memory cell transistors formed on a semiconductor substrate, each of said memory cell transistors including a laminated gate formed of a floating gate and a control gate, comprising the steps of:

forming a plurality of element separation regions in the semiconductor substrate in a row direction and a column direction for separating the memory cell transistors;
forming a gate oxide film on the semiconductor substrate;
forming a first conductive layer on the gate oxide film;
etching the first conductive layer to form a plurality of slits;
forming spacers on sidewall portions of each of the slits;
forming a first insulating film on the first conductive layer, the spacers, and the semiconductor substrate;
forming a second conductive layer on the first insulating film;
etching the first conductive layer, the second conductive layer, and the first insulating film using one single mask to form the laminated gate;
implanting a conductive impurity into the semiconductor substrate exposed on both sides of the laminated gate to form a drain/source region;
forming an interlayer insulating film; and
forming a contact hole penetrating the interlayer insulating film to reach the semiconductor substrate.

2. The method of producing the semiconductor memory according to claim 1, wherein, in the step of forming the spacers, a second insulating film is formed on the first conductive layer and the semiconductor substrate to fill the slits, and a portion of the second insulating film is removed through anisotropy etching to form the spacers.

3. The method of producing the semiconductor memory according to claim 1, wherein, in the step of forming the spacers, said spacers are formed of silicon oxide.

* * * * *